United States Patent [19]
Gomi

[11] Patent Number: 5,915,186
[45] Date of Patent: Jun. 22, 1999

[54] METHOD OF MANUFACTURING HETEROJUNCTION BIPOLAR DEVICE HAVING $SI_{1-X} GE_X$ BASE

[75] Inventor: Takayuki Gomi, Tokyo, Japan

[73] Assignee: Sony Corporation, Tokyo, Japan

[21] Appl. No.: 08/993,862

[22] Filed: Dec. 18, 1997

[30] Foreign Application Priority Data

Dec. 26, 1996 [JP] Japan .................................. 8-346917

[51] Int. Cl.⁶ ................................................ H01L 21/331
[52] U.S. Cl. .......................... 438/313; 438/322; 438/324; 438/325; 438/326; 438/340; 438/341; 438/933; 148/DIG. 10; 148/DIG. 11; 257/511; 257/512; 257/525; 257/555; 257/574
[58] Field of Search .................. 438/313, 322, 438/323, 324, 325, 326, 340, 341, 933, FOR 105, FOR 249, FOR 250, FOR 291; 148/DIG. 10, DIG. 11; 257/511, 512, 525, 555, 569, 574

[56] References Cited

U.S. PATENT DOCUMENTS

| | | |
|---|---|---|
| 4,133,701 | 1/1979 | Greenstein et al. .................. 438/340 |
| 4,314,359 | 2/1982 | Kato et al. ........................... 438/340 |
| 4,375,999 | 3/1983 | Nawata et al. ....................... 438/340 |
| 4,505,766 | 3/1985 | Nagumo et al. ..................... 438/326 |
| 4,970,174 | 11/1990 | Min et al. ............................. 438/340 |
| 5,273,915 | 12/1993 | Hwang et al. ........................ 437/34 |
| 5,494,836 | 2/1996 | Imai ...................................... 437/31 |
| 5,502,330 | 3/1996 | Johnson et al. ..................... 257/588 |
| 5,504,018 | 4/1996 | Sato ..................................... 437/31 |
| 5,541,124 | 7/1996 | Miwa et al. .......................... 437/31 |
| 5,599,723 | 2/1997 | Sato ..................................... 437/31 |
| 5,629,219 | 5/1997 | Miwa ................................... 438/322 |
| 5,643,806 | 7/1997 | Miwa et al. .......................... 437/31 |
| 5,670,394 | 9/1997 | Jerome et al. ....................... 438/322 |
| 5,712,174 | 1/1998 | Hirai et al. ........................... 438/322 |
| 5,766,999 | 6/1998 | Sato ..................................... 438/309 |

*Primary Examiner*—Peter Toby Brown
*Assistant Examiner*—Long Pham
*Attorney, Agent, or Firm*—Hill & Simpson

[57] ABSTRACT

In a semiconductor device manufacturing method for forming first and second bipolar transistors on a semiconductor substrate 1, a link base layer 5 for connecting a graft base layer (graft base layer 8) of the first bipolar transistor and an intrinsic base layer 12 to each other, and at least a part of a base layer 6 of the second bipolar transistor are formed simultaneously with each other, and then the link base layer 5 in a region where the intrinsic base layer 12 will be formed is removed by an etching treatment, and then by a selective epitaxial growth method, the intrinsic base layer 12 is formed in the region where the link base layer 5 is removed.

10 Claims, 15 Drawing Sheets

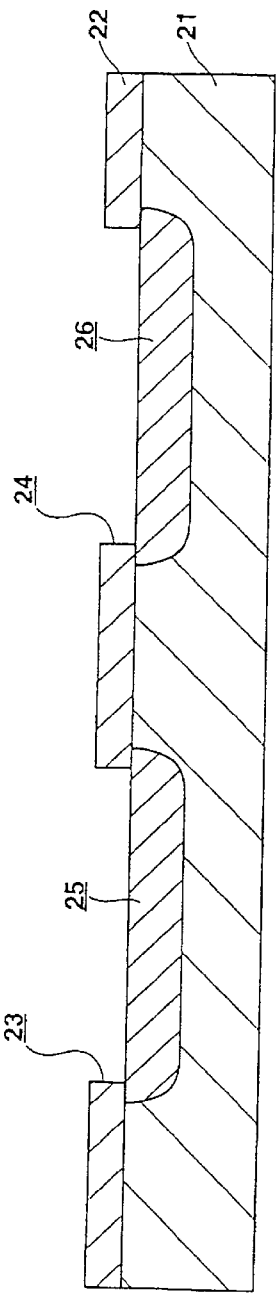
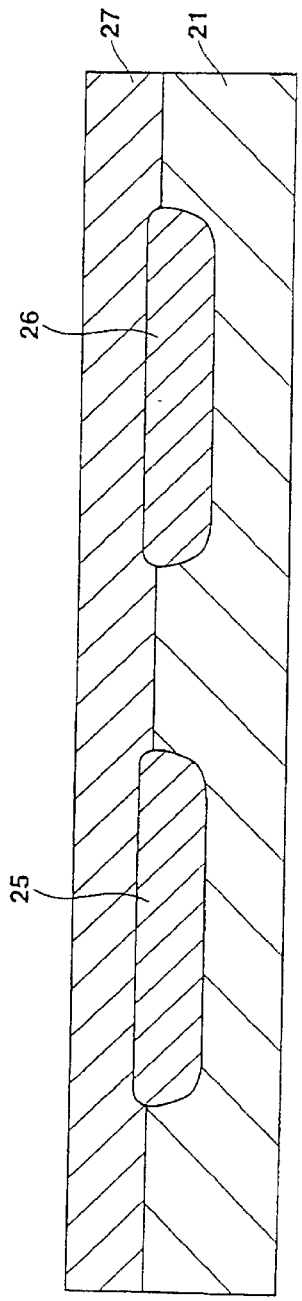
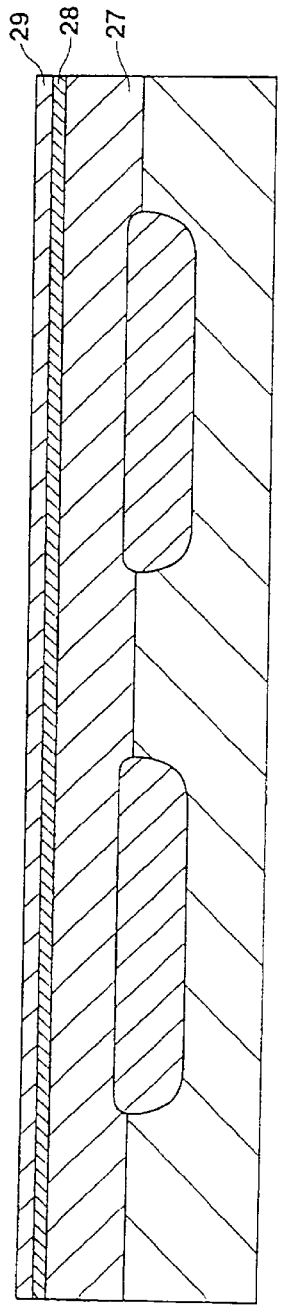
FIG.4A
FIG.4B
FIG.4C

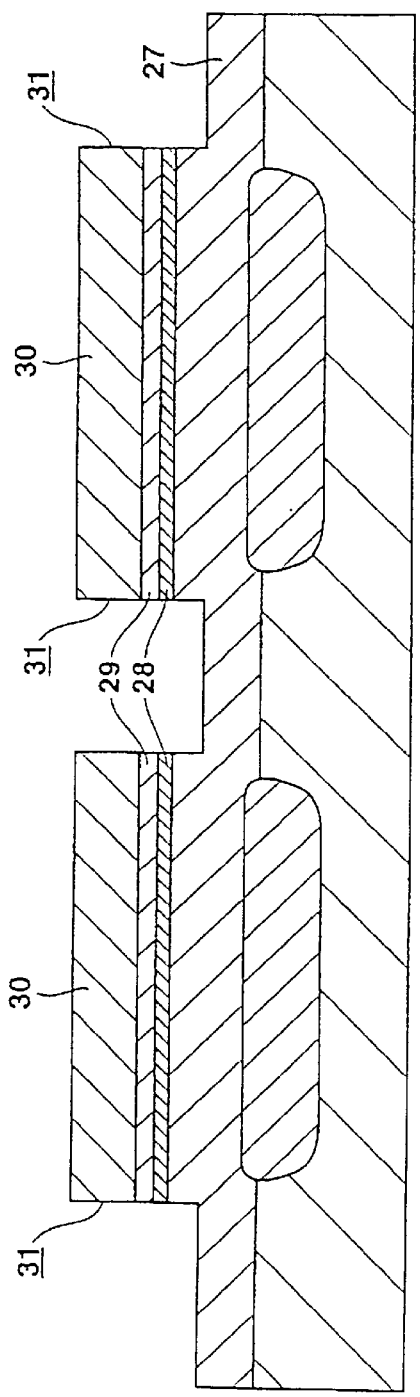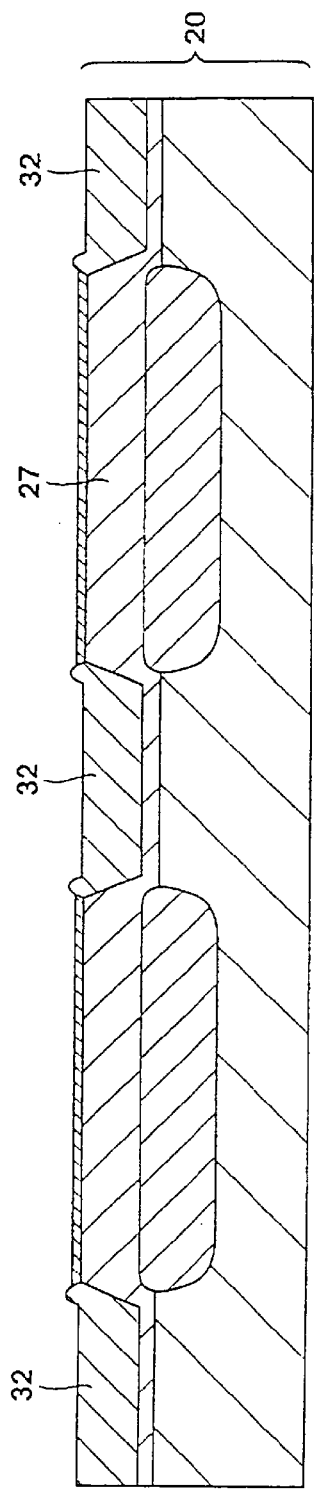

METHOD OF MANUFACTURING HETEROJUNCTION BIPOLAR DEVICE HAVING $SI_{1-X} GE_X$ BASE

BACKGROUND OF THE INVENTION

The present invention relates to a method of manufacturing a semiconductor device, and more particularly to a method of manufacturing a bipolar transistor having a so-called base self-alignment structure, and a method of manufacturing a semiconductor device in which a so-called narrow-base heterojunction bipolar transistor using silicon germanium mixed crystal for a base layer and a general silicon homojunction bipolar transistor are formed on the same substrate.

There has been proposed a silicon-based narrow-base type heterojunction bipolar transistor which uses a base of silicon germanium ($Si_{1-x}Ge_x$) as a material which can narrow the band gap in order to further increase the maximum cut-off frequency of the bipolar transistor (hereinafter referred to as fTmax), and fTmax of about 100 GHz or more has been reported. An information communication field has been considered as an application field because the multimedia age has come and much attention has been paid to the market possibilities thereof.

The high-speed bipolar transistor uses a so-called double polysilicon structure in which polysilicon thin films are used for an emitter electrode and a base electrode and an emitter/base self-alignment structure. The adoption of the self-alignment technique provides advantages that the emitter length can be set to the limit value of the exposure light width or less, and also that a parasite transistor portion is removed.

The heterojunction bipolar transistor which adopts a silicon germanium thin film for the base layer in the above structure is disclosed in Japanese Examined Patent Application No. Hei-6-66325.

However in a manufacturing method as disclosed in Japanese Examined Patent Application No. Hei-6-66325, in order to form a silicon germanium base region in a link base region 142 as shown in FIG. 1A, a part of the thin link region 142 is oxidized to form a thermal oxide layer 152 by a high-pressure oxidation technique. Thereafter, the thermal oxide layer 152 is removed by an etching treatment to remove the link base region 142 (a portion indicated by two-dotted chain line) which will serve as the silicon germanium base region as shown in FIG. 1B, which complicates the process.

Thereafter, a layer 154 which will serve as a P-type silicon germanium base region is formed on the overall surface as shown in FIG. 2A, and then an N-type emitter region 162 is formed by diffusion from a polysilicon layer 160 formed of $N^+$-type polysilicon on the layer 154 as shown in FIG. 2B.

Therefore, if the N-type emitter region 162 is formed shallowly, the P-type silicon germanium microcrystal layer on a side wall 148 would remain, so that a base leak current may increase. Here, the microcrystal means such a state that minute crystalline layers are contaminated in an amorphous layer. Accordingly, it is difficult to independently control the width of the layer 154 serving as the silicon germanium base region and the depth of the N-type emitter region 162.

Further, when a bipolar transistor LSI is actually implemented, an LEC (Lightly Emitter Concentration) type bipolar transistor which has a higher grounded emitter current amplification factor β and a high emitter/base withstand voltage, a bipolar transistor which is not so high in speed, but high in precision, etc. are needed on the same substrate in addition to the high-speed narrow-base heterojunction bipolar transistor using the silicon germanium layer as the base, if occasion demands. Accordingly, it is necessary to form a bipolar transistor in accordance with an application.

The present invention is directed to a method of manufacturing a semiconductor device in order to solve the above problem.

That is, according to a semiconductor device manufacturing method, the first bipolar transistor and the second bipolar transistor are formed on a semiconductor substrate, and a link base layer for connecting a graft base layer of the first bipolar transistor and an intrinsic base layer formed by an epitaxial growth method, and at least a part of a base layer of the second bipolar transistor are formed at the same time.

The above manufacturing method further includes a step of removing the link base layer which will serve as a region where the intrinsic base layer of the first bipolar transistor is formed, and a step of forming the intrinsic base layer in the region where the link base layer is removed, by the selective epitaxial growth method.

As another manufacturing method, after a side wall for separating the base and the emitter of the first bipolar transistor is formed on the side wall of an opening portion which is formed on the area where the intrinsic base is formed, and then the link base layer which will serve as the region where the intrinsic base layer of the first bipolar transistor is formed is removed. The film which is formed at the lower portion of the side wall and used as a buffer layer when the link base layer is formed is removed, and then the intrinsic base layer is formed in the area where the link base layer and the film used as the buffer layer are removed, by the selective epitaxial growth method.

In the above manufacturing method, since the link base layer for connecting the graft base layer of the first bipolar transistor and the intrinsic base layer formed by the epitaxial growth method, and at least a part of the base layer of the second bipolar transistor are formed at the same time, a large number of steps are not required to be added, and thus two kinds of bipolar transistors can be formed on the same substrate.

Since the intrinsic base layer is formed in the link base layer removed region by the selective epitaxial growth method, no P-type silicon germanium microcrystal is formed in an area other than the region where the intrinsic base layer is formed, for example, on the side wall which is formed to separate the emitter and the base. Therefore, the base width of the intrinsic base layer of silicon germanium and the depth of the emitter layer formed on the upper side of the intrinsic base layer are controlled independently of each other.

Further, since the intrinsic base layer of the first bipolar transistor is formed after the film which is formed at the lower portion of the side wall for separating the base and the emitter of the first bipolar transistor and used as the buffer layer when the link base layer of the first bipolar transistor is formed. The end portion of the intrinsic base layer formed by the selective epitaxial growth is far away from the emitter layer formed on the upper side of the intrinsic base layer by the distance corresponding to the thickness of the film which is used as the buffer layer and removed. Therefore, the end portion of the intrinsic base layer in which some defect is liable to occur is sufficiently far away from the emitter/base junction portion, so that the emitter/base junction can be stably formed.

BRIEF DESCRIPTION OF THE DRAWINGS

FIGS. 4A to 4C are first diagrams showing the manufacturing process of the first embodiment;

FIGS. 4D and 4E are second diagrams showing the manufacturing process of the first embodiment;

DETAILED DESCRIPTION OF PREFERRED EMBODIMENTS

Preferred embodiments according to the present invention will be described hereunder with reference to the accompanying drawings.

The first embodiment of a semiconductor device manufacturing method according to the present invention will be described with reference to FIGS. 3A to 3C.

Figure 1A:
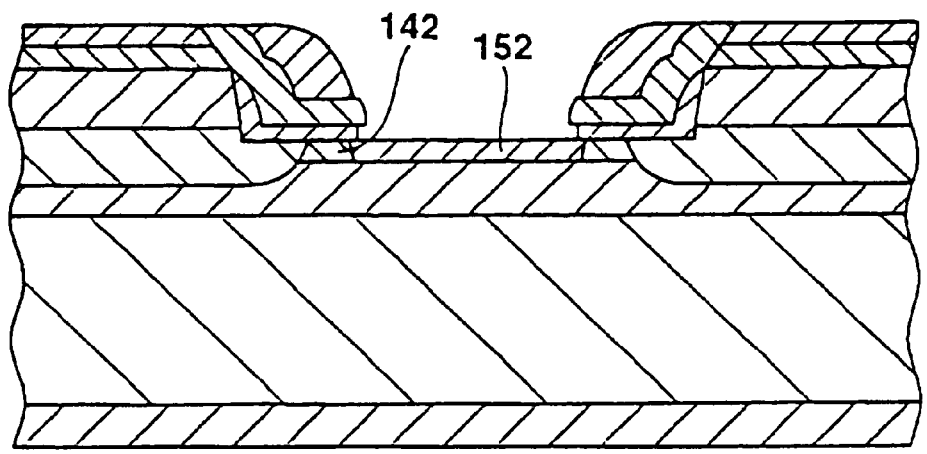
FIGS. 1A and 1B are diagrams showing a semiconductor device which is manufactured by a conventional method to explain the problems of the conventional method.
Figure 1B:
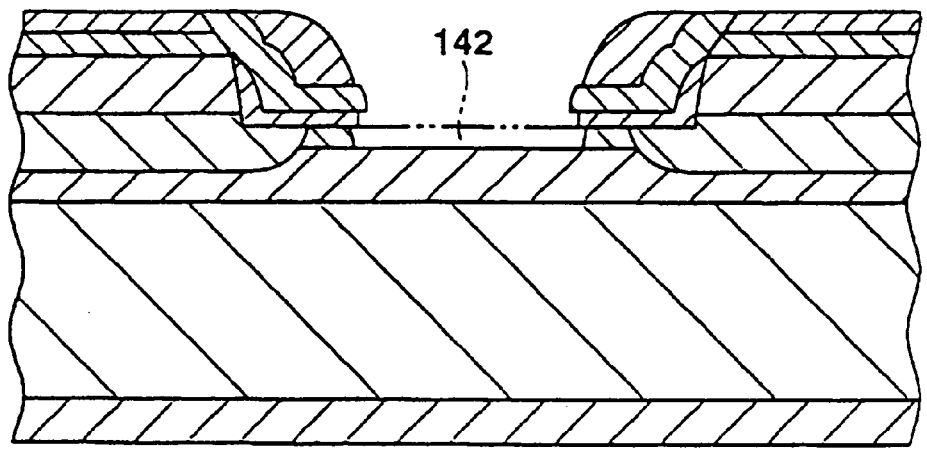
Figure 2A:
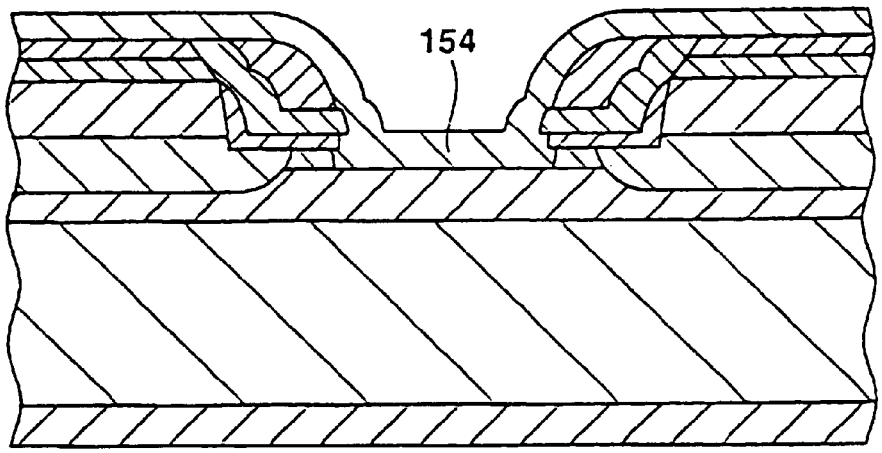
FIGS. 2A and 2B are diagrams showing the semiconductor device to explain the problems of the conventional method.
Figure 2B:
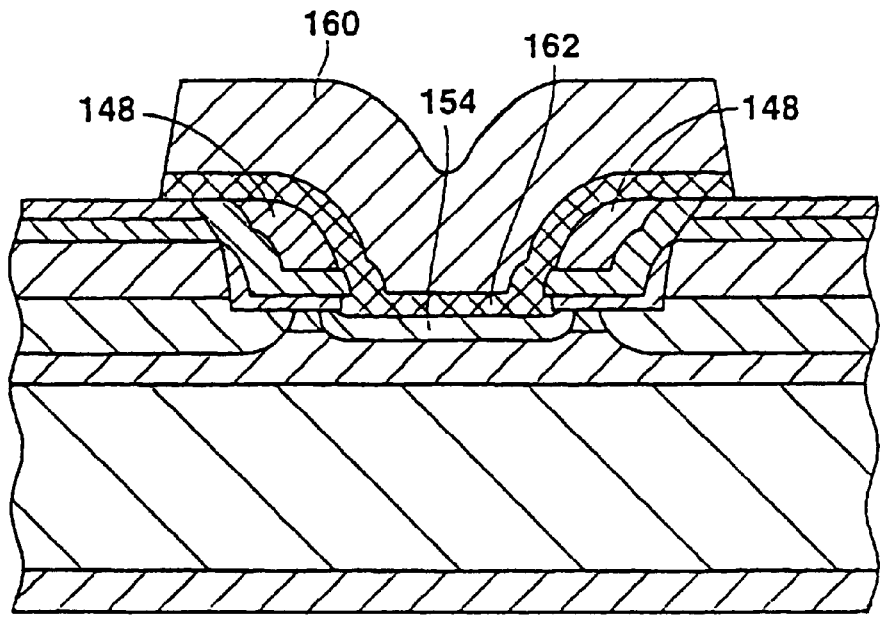
Figure 3A:
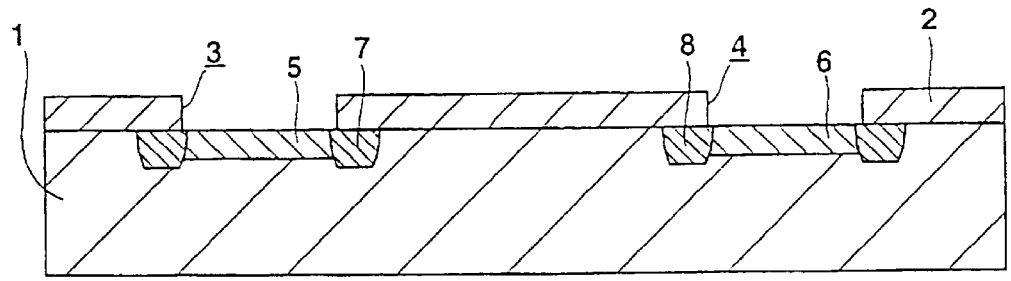
FIGS. 3A to 3C are diagrams showing a semiconductor device manufacturing process according to the first embodiment of the present invention.
Figure 3B:
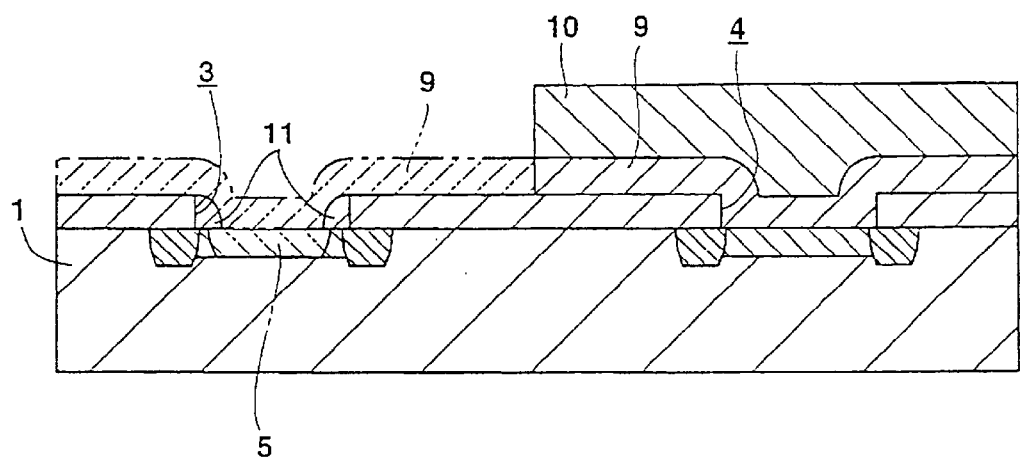
Figure 3C:
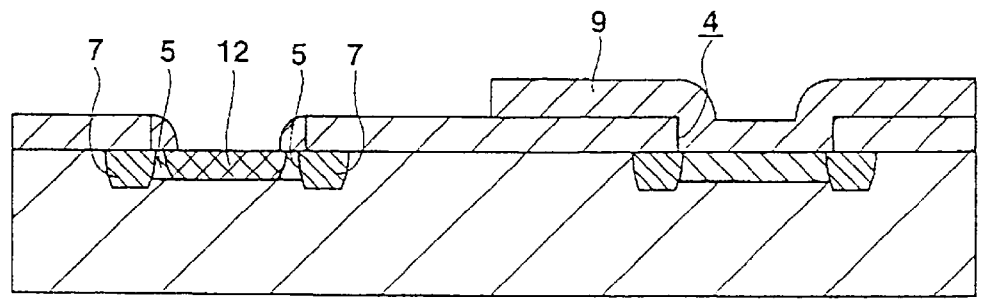

In FIGS. 3A to 3C, the first bipolar transistor is formed of a so-called narrow-base heterojunction bipolar transistor, and the formation of the base layer when the second bipolar transistor is generally formed of a homojunction bipolar transistor will be described.

As shown in FIGS. 3A to 3C, after a film 2 such as an insulating film or the like is formed on a semiconductor substrate 1, the first opening portion 3 and the second opening portion 4 are formed on the film 2 corresponding to a region where a base layer of the first bipolar transistor is formed and a region where a base layer of the second bipolar transistor is formed. Thereafter, impurities for forming the base layer such as boron is doped into the semiconductor substrate 1 through the first and second opening portions 3 and 4 by an ion implantation method. Thereafter, a heat process is performed to form a link base layer on the upper layer of the semiconductor substrate 1 at the bottom portion of the first opening portion 3. The link base layer 5 is used to connect the graft base layer of the first bipolar transistor and the intrinsic base layer which is formed by the epitaxial growth. At the same time the base layer 6 of the second bipolar transistor is formed on the upper layer of the semiconductor substrate 1 at the bottom portion of the second opening portion 4.

As not shown, constituent parts such as a collector region, a base electrode, etc. are formed on the semiconductor substrate 1 before the process shown in FIG. 3A is performed. Further, graft base layers 7 and 8 which will serve as graft base layers in the above heat process are also formed.

Subsequently, as shown in FIG. 3B, an insulating film 9 to form a side wall is formed not only in each of the first and second opening portions 3 and 4, but also on the semiconductor substrate 1. Further, a resist mask 10 is formed in a region where the second bipolar transistor will be formed. The portion of the insulating film 9 which is indicated by two-dotted chain lines is removed by etch-back to form an insulating side wall 11 on the side wall of the first opening portion 3.

Subsequently, the resist mask 10 is removed, and then the link base layer 5 (portion indicated by two-dotted chain line) in the region where the intrinsic base layer of the first bipolar transistor will formed is removed by an etching treatment using as a mask the insulating film 9 on the region where the second bipolar transistor will be formed.

As shown in FIG. 3C, by the selective epitaxial growth method, the intrinsic base layer 12 is formed in the region where the link base layer is removed. Accordingly, the intrinsic base layer 12 is connected to the graft base layer 7 through the link base layer 5.

Subsequently, as not shown, a resist mask is formed in the region where the first bipolar transistor will be formed, and then the insulating film 9 is etched back to form a side wall comprising the insulating film 9 on the side wall of the opening portion 4. Alternatively, a resist film having a window which is formed on a region where the emitter of the second bipolar transistor will be formed is formed, and the insulating film 9 is etched by using the resist film as a mask to form an emitter opening portion. Thereafter, the emitter layer, each electrode, etc. are formed.

In the above manufacturing method, the link base layer 5 for connecting the graft base layer 7 of the first bipolar transistor and the intrinsic base layer 12 which is formed by the epitaxial growth, and the base layer 6 of the second bipolar transistor are formed at the same time. Therefore, two types of bipolar transistors which are different in the material, concentration, the base width, etc. of the intrinsic base layer can be formed on the same semiconductor substrate 1 without making substantial additions to the process.

Further, by the selective epitaxial growth method, the intrinsic base layer 12 is formed in the region where the link base layer 5 is removed. Therefore, no P-type silicon germanium microcrystal layer is grown in a region other than the region where the intrinsic base layer 12 is formed, for example, no P-type silicon germanium microcrystal layer is formed on the side wall 11 which is formed to separate the emitter and the base, etc. Therefore, the base width of the intrinsic base layer 12 of silicon germanium and the depth of the emitter layer (not shown) formed on the upper layer of the intrinsic base layer 12 are independently controlled. That is, in the manufacturing method of the present invention, it is unnecessary to perform emitter-diffusion on the overall region to the depth direction of the layer which is formed by the epitaxial growth.

Next, a manufacturing method in which a so-called narrow-base heterojunction bipolar transistor as the first bipolar transistor and a general homojunction bipolar transistor as the second bipolar transistor are formed on the same substrate by using the manufacturing method shown in FIGS. 3A to 3C will be described in detail with reference to FIGS. 4A to 4U. Serial number is written in parentheses of each figure.

As shown in FIG. 4A, an oxide film 22 is formed of silicon oxide of about 300 nm in thickness on a P-type semiconductor substrate 21 of monocrystal silicon of <100> crystal orientation by a heat oxidation treatment. Thereafter, a resist mask (not shown) is formed by a normal lithography technique (hereinafter, the lithography technique means treatments such as resist coating, exposure, development, resist baking, etc.), and by the etching technique using the resist mask, and opening portions 23, 24 are formed in the oxide film 22 on regions where $N^+$-type buried layers are formed, which correspond to a region where the first bipolar transistor will be formed and a region where the second bipolar transistor will be formed. Subsequently, after the resist mask is removed, $N^+$-type buried layers 25, 26 are formed in the upper layer of the semiconductor substrate 11 by diffusing antimony in vapor phase with antimony oxide ($Sb_2O_3$) as a solid diffusion source. At this time, the sheet resistance ρs is set to 20Ω/□ to 50Ω/□, for example, and the diffusion depth is set to about 1 μm to 2 μm.

The oxide film 22 and the oxide film (not shown) which is formed in the diffusion process in vapor phase of antimony are removed by the etching.

Subsequently, as shown in FIG. 4B, an N-type epitaxial layer 27 is formed on the semiconductor substrate 21 by the epitaxial growth method. The N-type epitaxial layer 27 is designed to have a specific resistance of 0.3Ω cm to 5Ω cm and a thickness of about 0.7 μm to 2 μm. At this time, the $N^+$-type buried layers 25, 26 are diffused into the lower layer of the N-type epitaxial layer 27.

Subsequently, as shown in FIG. 4C, an oxide film which will serve as a buffer layer when a selective oxidation (LOCOS) method is performed is formed of silicon oxide at a thickness of about 20 nm to 50 nm by the normal oxidation method, for example. Further, by the chemical vapor deposition under reduced pressure [hereinafter, the chemical vapor deposition is referred to as CVD (CVD stands for Chemical Vapor Deposition)] method, a nitride film 29 is formed of silicon nitride at a thickness of about 50 nm to 100 nm on the oxide film 28, for example.

Each film thickness of the oxide film 28 and the nitride film 29 is determined by the length of (bird's beak) formed in the oxidation process, the stress due to the oxidation and the controllability of occurrence of defects.

Subsequently, the normal lithography technique is applied as shown in FIG. 4D. First, after a resist film 30 is formed on the nitride film 29 by a resist coating process, and then a resist opening portion 31 is formed in the resist film on a region where an element separating oxide film is formed to separate the regions where the first and second bipolar transistors will be formed by treatments such as exposure, development, baking, etc. The nitride film 29, the oxide film 28 and the upper layer of the N-type epitaxial layer 27 at the bottom portion of the resist opening portion 31 are removed by means of the etching technique (for example, reactive ion etching) using the resist film 30 as a mask.

The removal amount of the N-type epitaxial layer 27 is preferably set to substantially a half of the thickness of the oxide film so that the surface is substantially flattened after the LOCOS oxidation process.

After the resist film 30 is removed, as shown in FIG. 4E, an element separation oxide film 32 of about 0.6 μm to 1.5 μm in thickness is formed in the N-type epitaxial layer 27 by steam oxidation in a temperature atmosphere of 1000° C. to 1050° C. and for about 2 to 6 hours.

Thereafter, the nitride film 29 (see FIG. 4D) is removed by the etching treatment using hot phosphoric acid to thereby form the substrate 20.

Figure 4F:
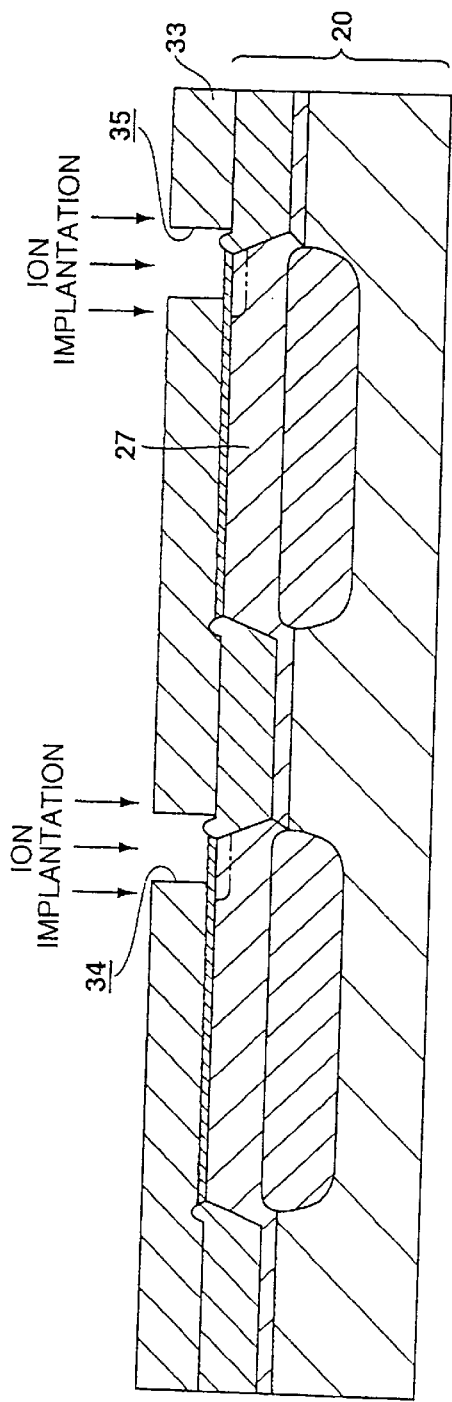
FIGS. 4F and 4G are third diagrams showing the manufacturing process of the first embodiment.

Subsequently, as shown in FIG. 4F, the normal lithographic technique is performed. First, after the resist film 33 is formed on the substrate 20 by the resist coating, resist opening portions 34, 35 are formed in the resist film 33 on regions where collector takeoff diffusion layers of the first and second bipolar transistors will be formed by the treatments such as the exposure, the development, the baking, etc. Subsequently, by the ion implantation technique using the resist film 33 as a mask, the impurities to form the collector takeoff diffusion layers are doped into the N-type epitaxial layer 27 through the resist opening portions 34, 35 by the ion implantation. As an ion implantation condition, phosphor ions ($P^+$) are used as the impurities, the implantation energy is set to about 40 keV to 100 keV, and the dose amount is set to about $1 \times 10^{15}$ number/$cm^2$ to $1 \times 10^{16}$ number/$cm^2$.

Figure 4G:
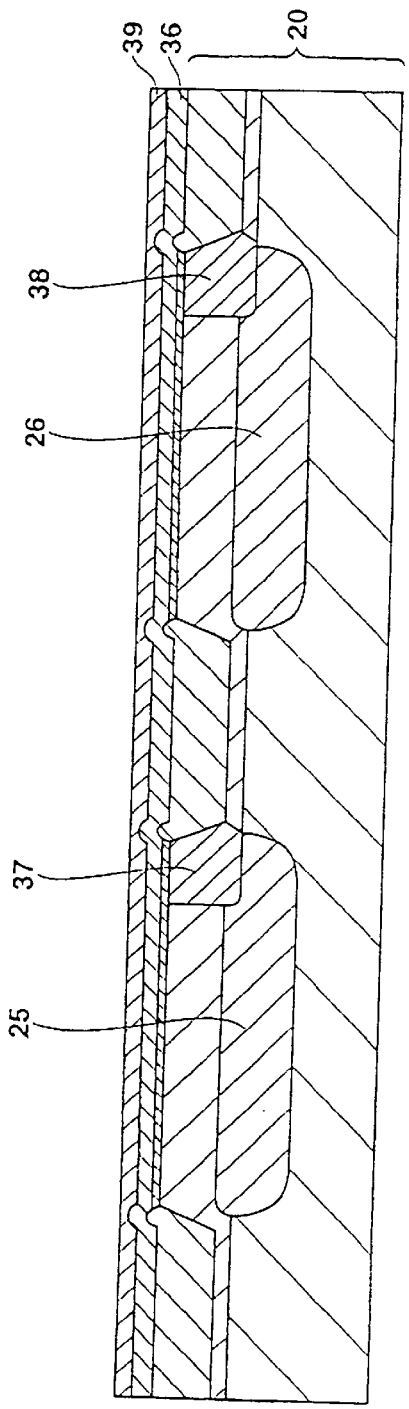

Subsequently, as shown in FIG. 4G, an oxide film 36 for flattening is formed of silicon oxide at a thickness of about 100 nm to 600 nm on the substrate 20 as shown in FIG. 4G by the CVD method, for example. Thereafter, an annealing treatment is performed at 900° C. to 1000° C. for about 30 minutes to activate the impurities doped by the ion implantation, thereby forming the $N^+$-type collector takeoff diffusion layers 37, 38 which connected in correspondence with the $N^+$-type buried layers 25, 26. Further, a resist film 39 for flattening (bird's head) is formed on the oxide film 36 by the resist coating technique.

Thereafter, the resist film 39, the oxide film 36, etc. are etched by the etch-back technique to flatten the surface of the substrate 20.

Figure 4H:
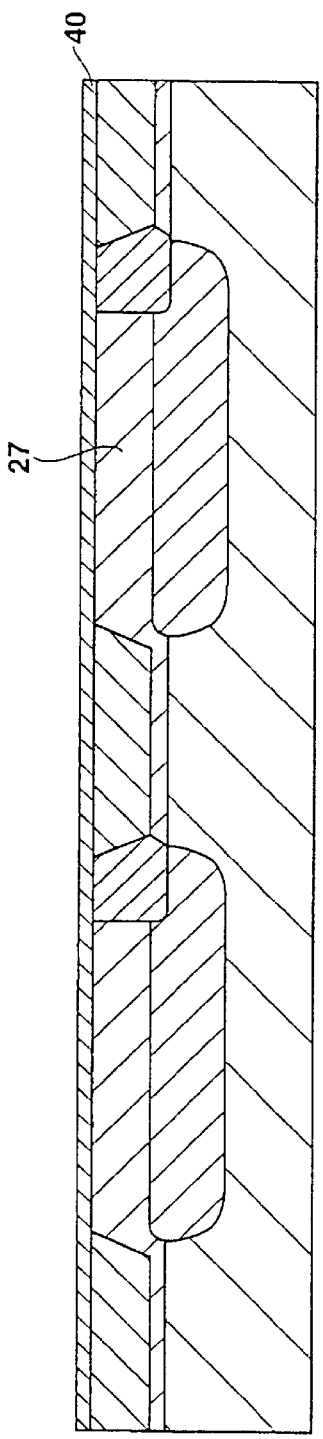
FIGS. 4H and 4I are fourth diagrams showing the manufacturing process of the first embodiment.

Subsequently, as shown in FIG. 4H, an oxide film 40 is formed of silicon oxide at a thickness of about 10 nm to 30 nm on the surface at the N-type epitaxial layer 27 side.

Figure 4I:
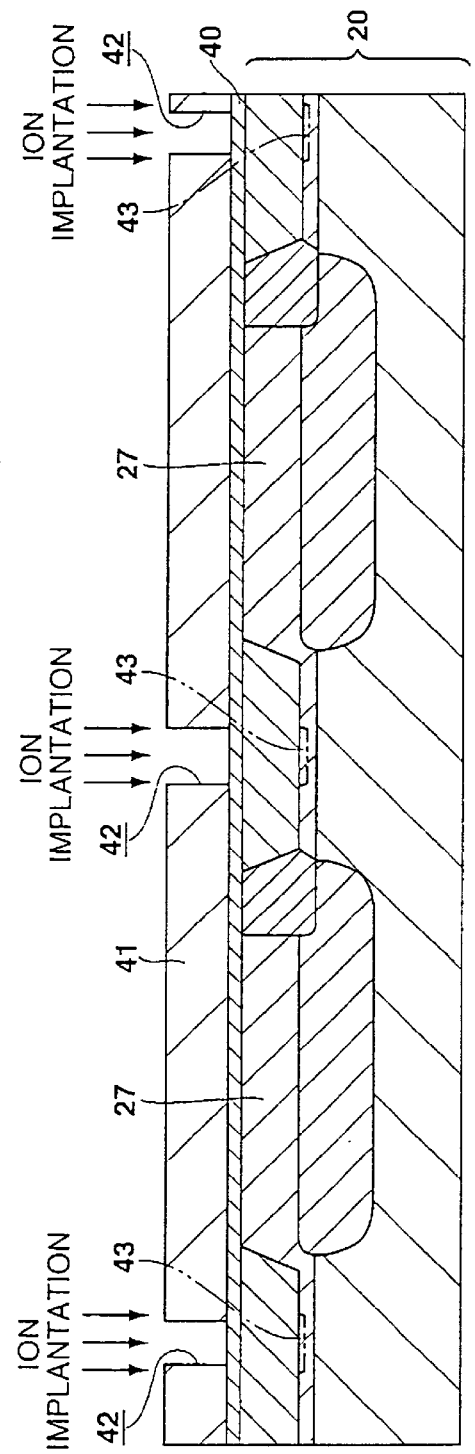

Subsequently, as shown in FIG. 4I, the normal lithographic technique is performed. First, a resist film 41 is formed on the substrate 20 on which the oxide film 40 is formed by the resist coating, and then by the treatments such as the exposure, the development, the baking, etc., a resist opening portion 42 is formed on the resist film 41 on a region where an element separating diffusion layer to separate regions where the first and second bipolar transistors will be formed will be formed. Subsequently, by the ion implantation technique using the resist film 41 as a mask, P-type impurities are doped into the N-type epitaxial layer 27 from the resist opening portion 42 to form the element separation diffusion layer 43, As the ion implantation condition, boron ions (B+) are used as the impurities, the implantation energy is set to about 200 keV to 500 keV, and the dose amount is set to about $1 \times 10^{13}$ number/$cm^2$ to $1 \times 10^{14}$ number/$cm^2$.

Figure 4J:
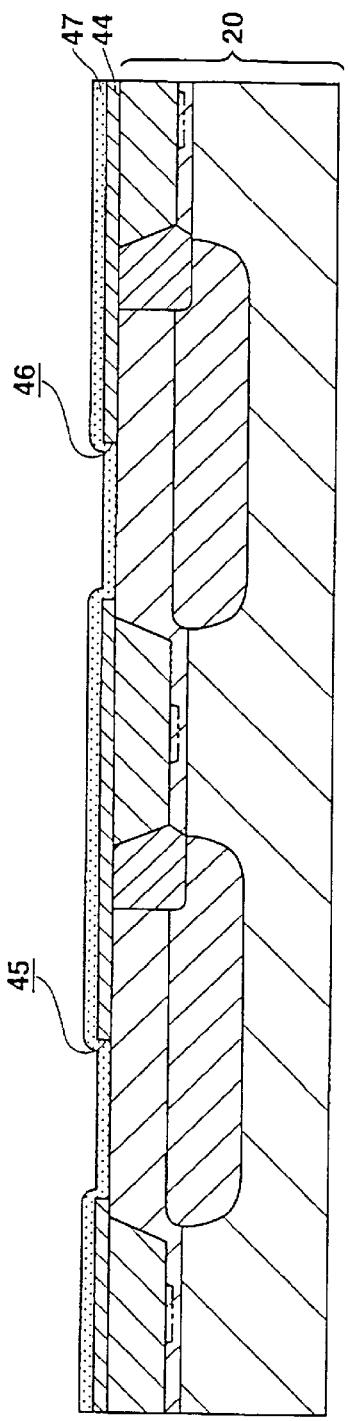
FIGS. 4J and 4K are fifth diagrams showing the manufacturing process of the first embodiment.

Thereafter, the resist film 41 is removed. Subsequently, as shown in FIG. 4J, an oxide film 44 is formed of silicon oxide at a thickness of about 50 nm to 300 nm on the substrate 20 by the CVD method. Subsequently, a resist mask (not shown) is formed by the normal lithographic technique, and by the etching technique using the resist mask, opening portions 45, 46 are formed in the oxide film 44 on the regions where the base layers are formed and which correspond to the region where the first bipolar transistor will be formed and the region where the second bipolar transistor will be formed respectively. At this time, the oxide film 40 (see FIG. 4I) in the opening portions 45, 46 is removed.

Subsequently, a polysilicon film 47 is formed at a thickness of about 100 nm to 300 nm both in the opening portions 45, 46 and on the oxide film 44 by the CVD method, for example. Thereafter, by the ion implantation technique, boron difluoride ions ($BF_2^+$) are doped as P-type impurities in the polysilicon film 47. As the ion implantation condition, the implantation energy was set to about 20 keV to 100 keV, and the dose amount is set to about $1 \times 10^{14}$ number/cm$^2$ to $1 \times 10^{16}$ number/cm$^2$.

Figure 4K:
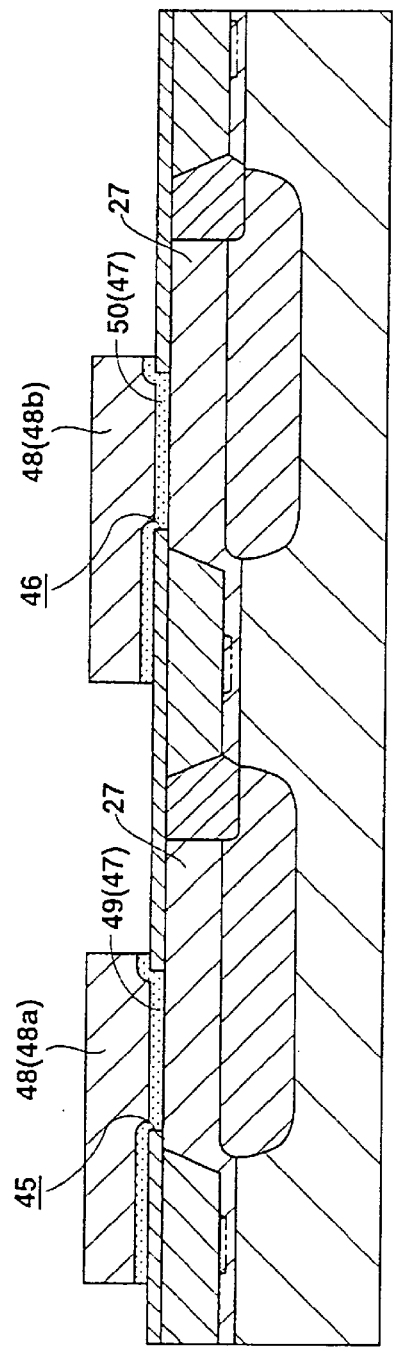

Subsequently, as shown in FIG. 4K, the normal lithography technique is performed. First, a resist film 48 is formed on the polysilicon film 47 by the resist coating. Subsequently, by the treatments such as the exposure, the development, the baking, etc., the resist films 48 (48a, 48b) remain on the regions where a base electrode will be formed. Further, by the etching technique (for example, reactive ion etching) using each resist film 48 as a mask, the polysilicon film 47 is patterned. As a result, a base electrode 49 of the first bipolar transistor is formed so as to be connected to the N-type epitaxial layer 27 from the opening portion 45, and a base electrode 50 of the second bipolar transistor is formed so as to be connected to the N-type epitaxial layer 27 from the opening portion 46.

Figure 4L:
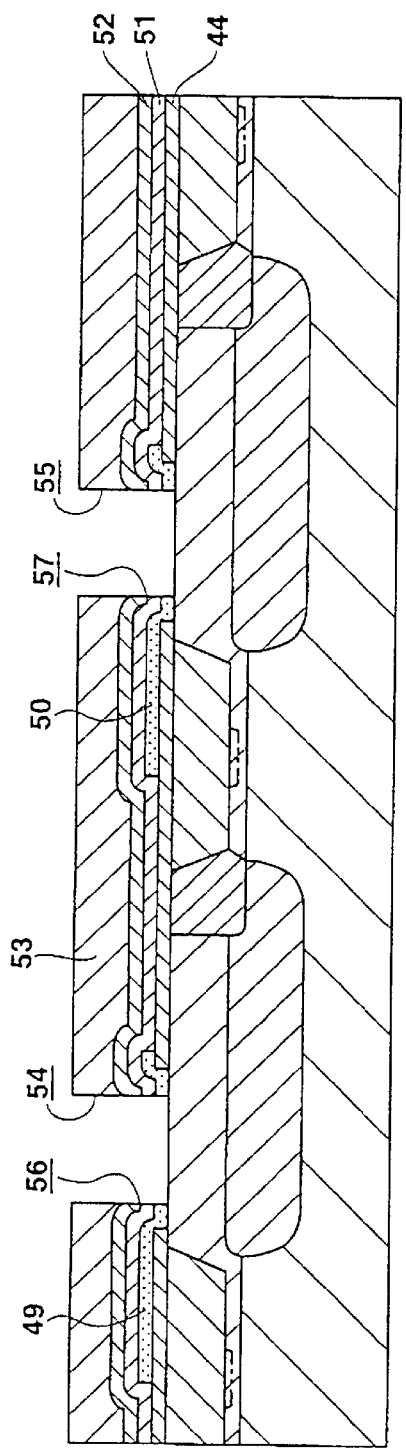
FIGS. 4L and 4M are sixth diagrams showing the manufacturing process of the first embodiment.

Thereafter, the resist film 48 is removed. Subsequently, as shown in FIG. 4L, an oxide film (for example, silicon oxide film) 51 and a nitride film (for example, silicon nitride film) 52 are laminated on the oxide film 44 so as to cover the base electrodes 49, 50, respectively. Subsequently, the normal lithography technique is performed. First, a resist film 53 is formed on the nitride film 52 by the resist coating. Subsequently, by the treatments such as the exposure, the development, the baking, etc., resist opening portions 54, 55 are formed in the resist film 53 on regions where the intrinsic bases of the first and second bipolar transistors will be formed. Subsequently, by the etching using the resist film 53 as a mask, opening portions 56, 57 are formed on the nitride film 52, the oxide film 51 and each of the base electrodes 49, 50.

Figure 4M:
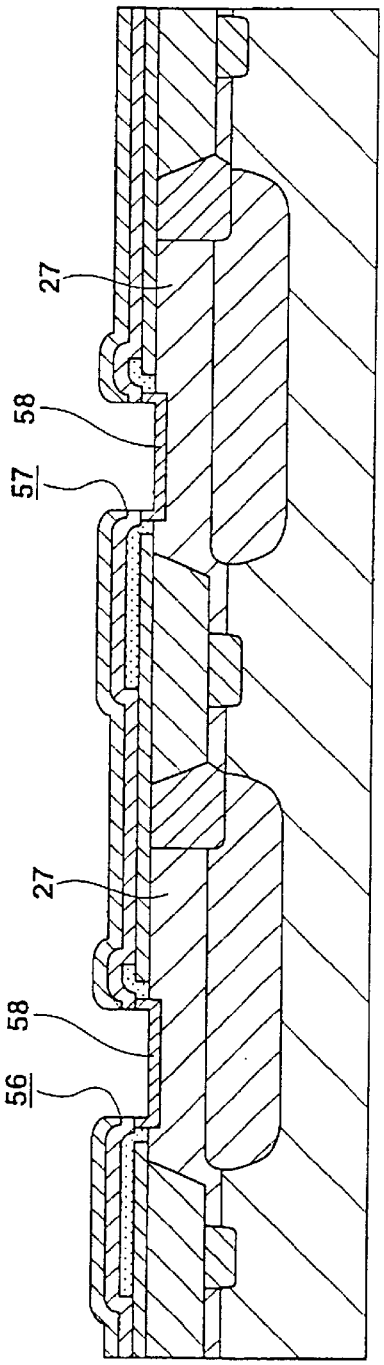

Thereafter, the resist film 53 is removed. Subsequently, as shown in FIG. 4M, a thin oxide film 58 is formed at a thickness of 5 nm to 30 nm on the surface of the N-type epitaxial layer 27 at the bottom portions of the opening portions 56, 57 by the oxidation. At this time, the exposure surface of each of the base electrodes 49, 50 is also oxidized. Subsequently, by the ion implantation method P-type impurities for forming a link base layer are doped from the opening portion 56 into the upper layer of the N-type epitaxial layer 27 of the first bipolar transistor by the ion implantation method. Further, P-type impurities for forming the overall or a part of the base layer are doped from the opening portion 57 into the upper layer of the N-type epitaxial layer 27 of the second bipolar transistor by the ion implantation method. As the ion implantation condition, boron difluoride ions ($BF_2^+$) are used as the P-type impurities, the implantation energy is set to about 10 keV to 40 keV, and the dose amount is set to about $1 \times 10^{12}$ number/cm$^2$ to $1 \times 10^{14}$ number/cm$^2$.

In the following figures, the thin oxide film 58 is omitted from the illustration except for enlarged views.

Figure 4N:
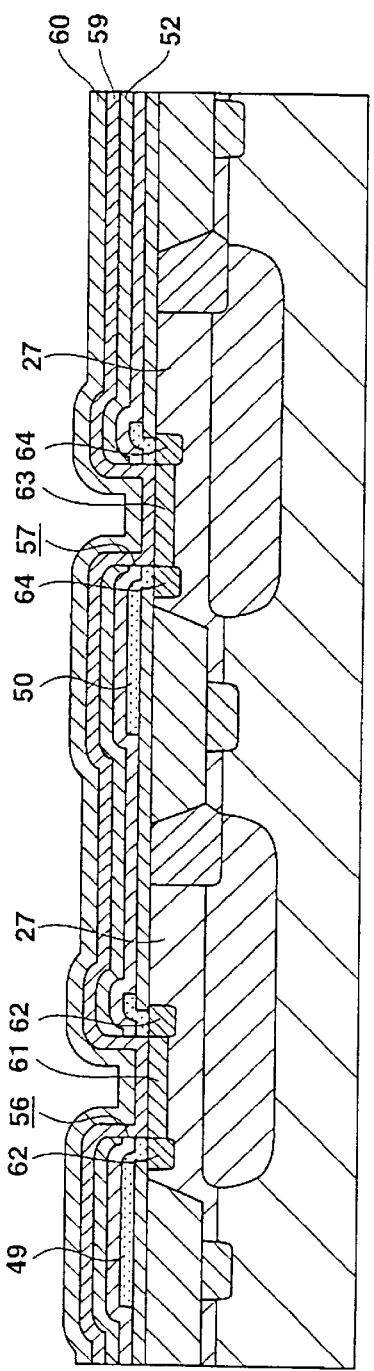
FIGS. 4N and 4O are seventh diagrams showing the manufacturing process of the first embodiment.

Subsequently, as shown in FIG. 4N, a nitride film (for example, silicon nitride film) 59 and an oxide film (for example, a silicon oxide film) 60 are laminated both in each of the opening portions 56, 57 and on the nitride film 52 by the CVD method, for example. Thereafter, the anneal treatment is performed to diffuse the ion-implanted impurities, thereby forming a link base layer 61 in the upper layer of the N-type epitaxial layer 27 at the bottom portion of the opening portion 56. In addition, a $P^+$-type graft base layer 62 is formed so as to be connected to the link base layer 61 by the diffusion of impurities from the base electrode 49. On the other hand, a base layer 63 is formed in the upper layer of the N-type epitaxial layer 27 at the bottom portion of the opening portion 57. In addition, a $P^+$-type graft base layer 64 is formed so as to be connected to the base layer 63 by the diffusion of impurities from the base electrode 50.

Figure 4O:
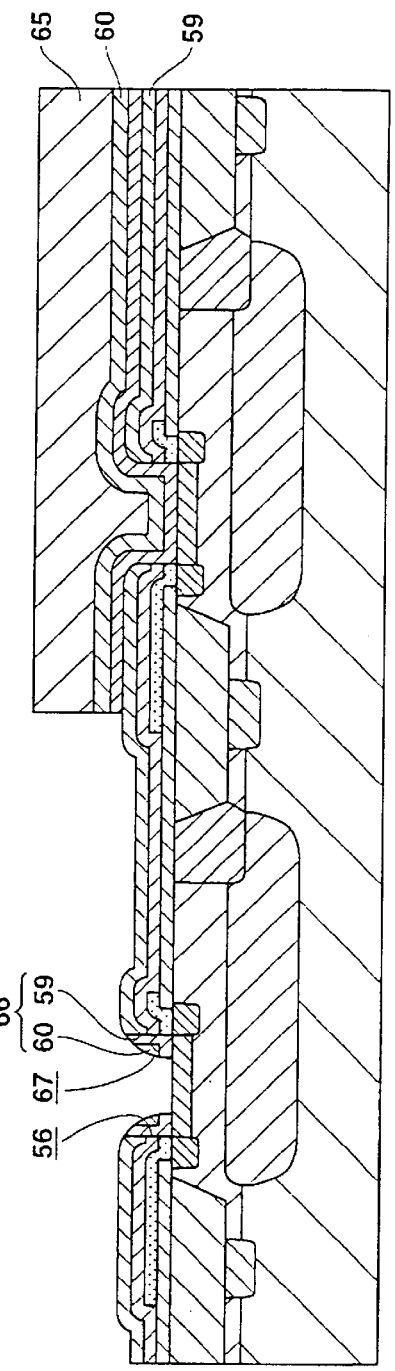

Subsequently, as shown in FIG. 4O, the normal lithography technique is performed. First, a resist film 65 is formed on the oxide film 60 by the resist coating. Subsequently, by the treatments such as the exposure, the development, the baking, etc., the resist film 65 remains on the region where the second bipolar transistor will be formed. By using the etching technique (for example, the reactive ion etching) using the resist film 65 as a mask, the nitride film 59 and the oxide film 60 in the regions where the first bipolar transistor will be formed are etched, the nitride film 59 and the oxide film 60 are left on the region where the second bipolar transistor will be formed, and a side wall 66 comprising the nitride film 59 and the oxide film 60 is formed on the side wall of the opening portion 56. The opening portion surrounded by the side wall 66 serves as an emitter opening portion 67. At this time, the thin oxide film 58 (not shown) which is formed at the bottom portion of the opening portion 56 is also removed except for the lower portion side of the side wall 66.

Figure 4P:
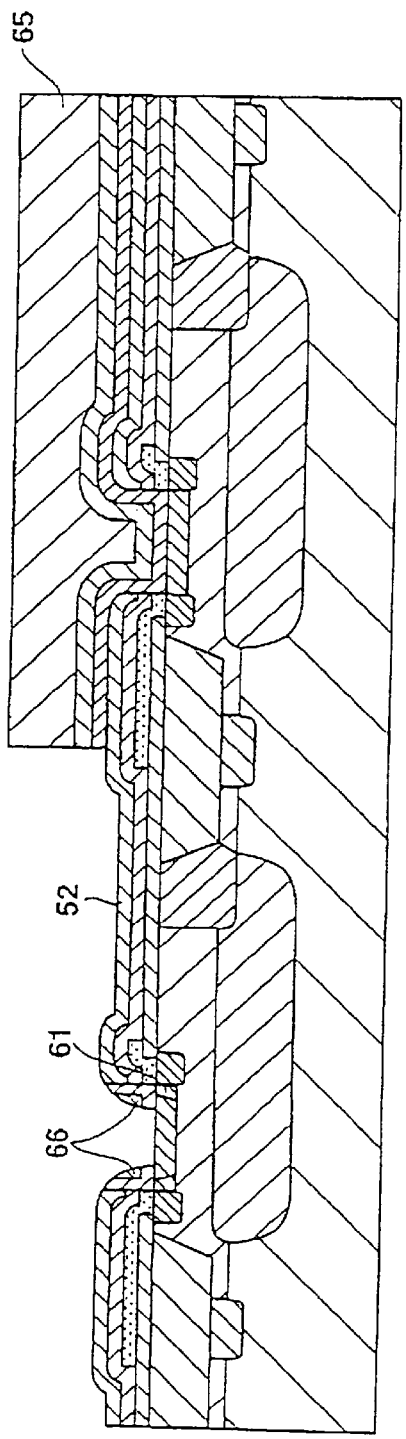
FIGS. 4P and 4Q are eighth diagrams showing the manufacturing process of the first embodiment.
Figure 4Q:
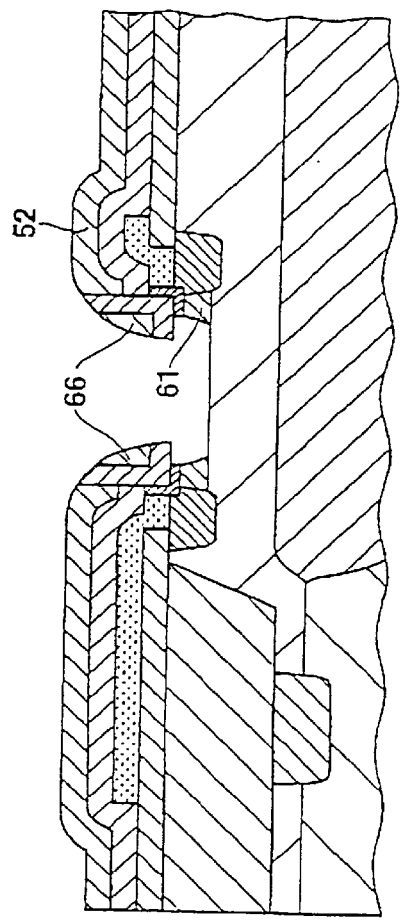

Subsequently, as shown in enlarged views of FIGS. 4P and 4Q, the link base layer 61 at the portion corresponding to the region where the intrinsic base layer of the first bipolar transistor will be formed is removed by the etching (for example, isotropic etching) by using the resist film 65, the side wall 66, the nitride film 52, etc. as masks. Accordingly, a so-called under-cut is formed at the lower portion side of the side wall 66. The etching is applied to the overall area or a part of the link base layer 61.

As the isotropic etching technique is used an etching treatment using so-called SC-I boil liquid which is obtained by heating mixed liquid of hydrogen peroxide and solution of ammonium. In this case, the etching is performed after the resist film 65 is removed. Alternatively, an isotropic plasma etching is used. In the case of the isotropic plasma etching, it may be performed continuously with the etching for forming the side wall 66.

Figure 4R:
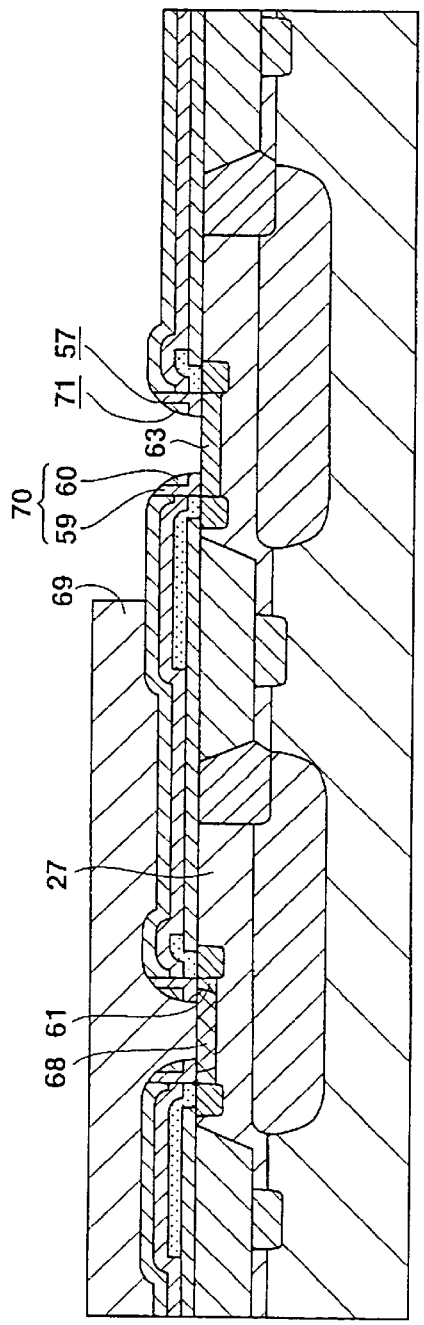
FIGS. 4R and 4S are ninth diagrams showing the manufacturing process of the first embodiment.

Thereafter, the resist film 65 is removed. As shown in FIG. 4R, by the selective epitaxial technique based on an ultra-high-vacuum chemical vapor deposition (UHV-CVD) method, a pressure-reduced CVD method or the like, an intrinsic base layer 68 of the first bipolar transistor formed of silicon germanium ($Si_{1-x}Ge_x$) mixed crystal is formed on the N-type epitaxial layer 27 at the portion at which the link base layer 61 is etched. Here, X is set to satisfy $0<X<1$.

Subsequently, by the normal lithography technique, a resist film 69 is formed on the region where the first bipolar transistor will be formed. Subsequently, by the etching technique (for example, the reactive ion etching) using the resist film 69 as a mask, the nitride film 59 and the oxide film 60 are etched on the region where the second bipolar transistor will be formed, thereby forming a side wall 70 comprising the nitride film 59 and the oxide film 60 on the side wall of the opening portion 57. The opening portion surrounded by the side wall 70 will serve as an emitter opening portion 71. The upper layer of the base layer 63 is removed by the over-etching of the reactive ion etching and the subsequent removal etching of the damage layer.

Figure 4S:
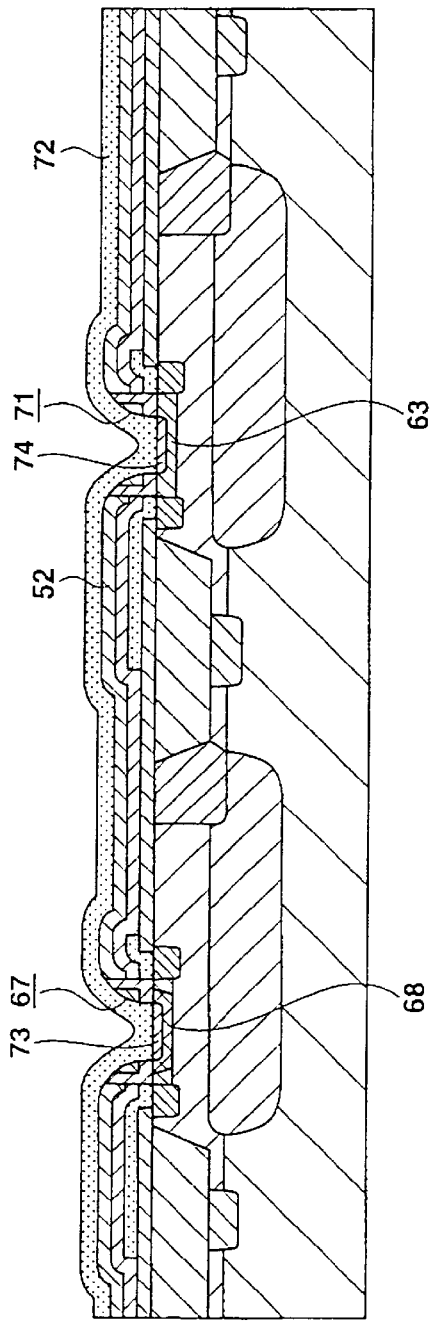

Subsequently, as shown in FIG. 4S, a polysilicon film 72 containing high-concentration N-type impurities which serves as an emitter electrode of each of the first and second bipolar transistors is formed both in each of the emitter opening portions 67, 71 and on the nitride film 52 by the CVD method, for example. Subsequently, the emitter annealing is performed in a temperature atmosphere of 700° C. to 1000° C. to form an N$^+$-type emitter layer 73 in the upper layer of the intrinsic base layer 68 and also an N$^+$-type emitter layer 74 in the upper layer of the base layer 63.

Figure 4T:
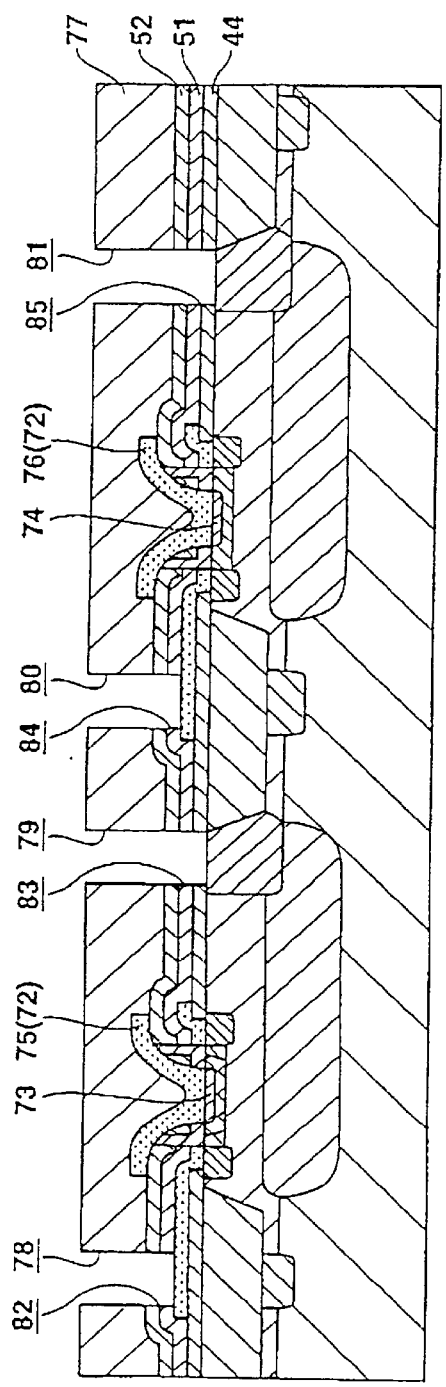
FIGS. 4T and 4U are tenth diagrams showing the manufacturing process of the first embodiment.

Subsequently, a resist mask (not shown) is formed by the normal lithography technique, and further by the etching technique using the resist mask, an emitter electrode 75 which is connected to the N$^+$-type emitter layer 73 is formed by the polysilicon film 72 as shown in FIG. 4T, and an emitter electrode 76 connected to the N$^+$-type emitter layer 74 is formed. Subsequently, the resist mask is removed.

Subsequently, the normal lithography technique is performed. After a resist film 77 is formed by the resist coating, by the treatments such as the exposure, the development, the baking, etc., opening portions 78 to 81 are formed in the resist film 77 on regions where each base contact and each collector contact will be formed. By the etching technique (for example, the reactive ion etching) using the resist film 77 as a mask, the nitride film 52, the oxide film 51, the oxide film 44, etc. are etched to form contact holes 82 to 84.

Figure 4U:
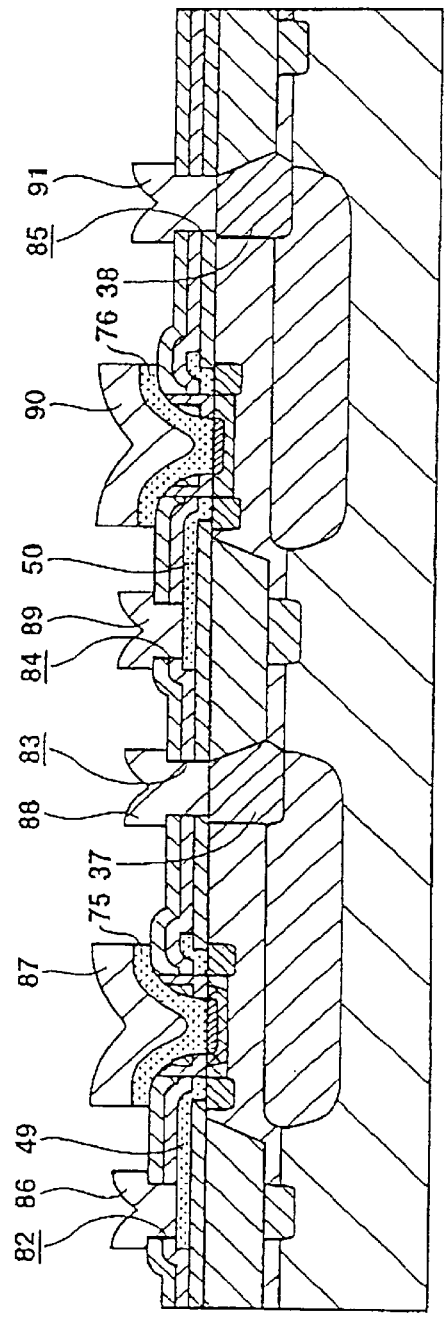

Thereafter, the resist film 77 is removed, as shown in FIG. 4U, an electrode forming layer which comprises a via metal layer and an aluminum-based metal layer is formed by a sputtering method, for example. Subsequently, a resist mask (not shown) is formed by the normal lithography technique, and by the etching technique (for example, the reactive ion etching) using the resist mask, the electrode forming layer is patterned to form a metal electrode 86 connected through the contact hole 82 to the base electrode 49, a metal electrode 87 connected to the emitter electrode 75, a metal electrode 88 connected through the contact hole 83 to the collector takeoff diffusion layer 37, a metal electrode 89 connected through the contact hole 84 to the base electrode 50, a metal electrode 90 connected to the emitter electrode 76, and a metal electrode 91 connected through the contact hole 85 to the collector takeoff diffusion layer 38. Thereafter, the resist mask is removed, and then a process of multilayer wiring is performed.

Next, the second embodiment according to the semiconductor device manufacturing method of the present invention will be described with reference to the manufacturing process diagrams of FIGS. 5A to 5D.

In FIGS. 5A to 5D, the same constituent parts as shown in FIGS. 4A to 4U are represented by the same reference numerals.

In the second embodiment, in order to prevent the defective area occurring at the end portion of the epitaxial growth layer from invading into the emitter/base junction in the selective epitaxial growth process of the silicon germanium (Si$_{1-x}$Ge$_x$) layer, an etching process of hydrofluoric acid is introduced after the side wall is formed to expand the forming area of the epitaxial growth in the lateral direction.

First, the process which is the same as described with reference to FIG. 4A to 4O will be described.

Figure 5A:
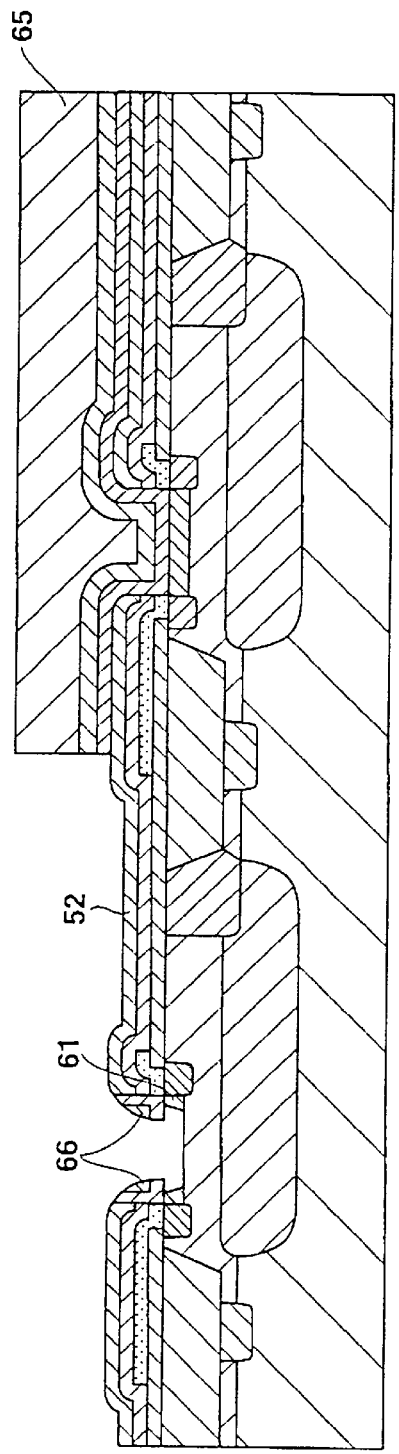
FIGS. 5A and 5B are first diagrams showing a main process of the second embodiment according to the semiconductor device manufacturing method of the present invention.
Figure 5B:
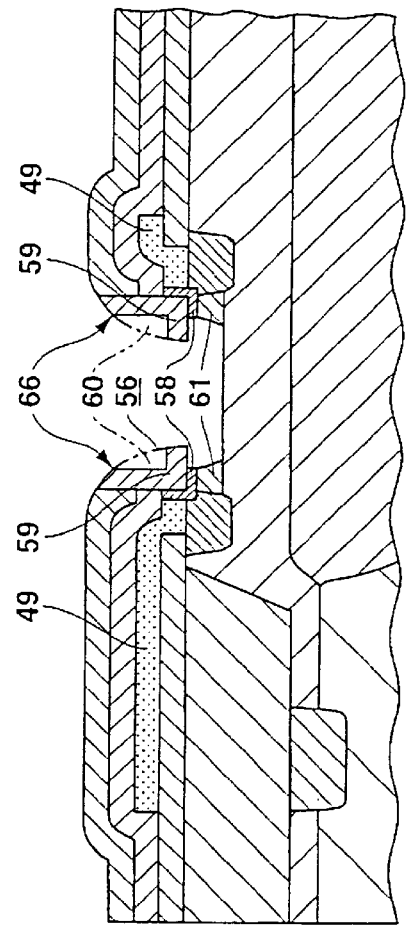
Figure 5C:
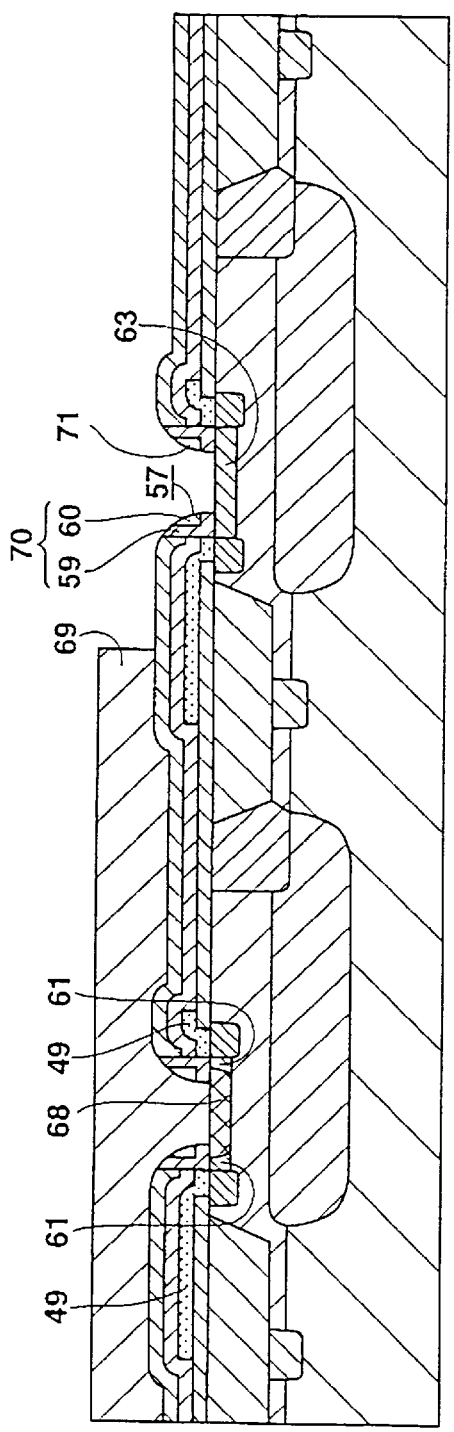
FIGS. 5C and 5D are second diagrams showing the main manufacturing diagram of the second embodiment according to the semiconductor device manufacturing method of the present invention.
Figure 5D:
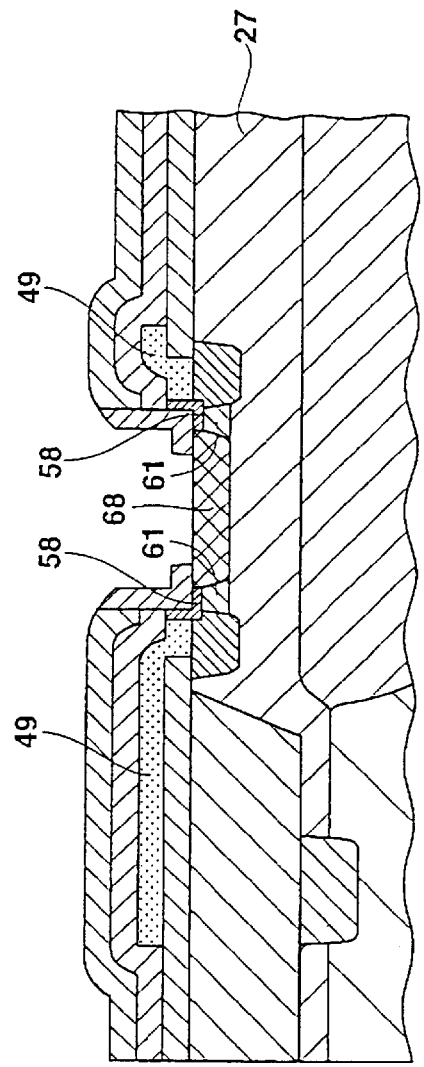

Thereafter, as shown in the enlarged views of the first bipolar transistor FIGS. 5A and 5B, the link base layer 61 at the portion corresponding to the region where the intrinsic base layer of the first bipolar transistor is formed is removed through the etching treatment (for example, isotropic etching) by using the resist film 65, the side wall 66, the nitride film 52, etc. as masks. Accordingly, a so-called under-cut is formed at the lower portion side of the side wall 66. The etching is performed on the overall area or a part of the link base layer 61.

Further, the isotropic etching technique is an etching using so-called SC-I boil liquid which is obtained by heating mixed liquid of hydrogen peroxide solution and ammonium solution. In this case, it is performed after the resist film 65 is removed. Alternatively, an isotropic plasma etching treatment is performed.

Further, by a wet etching of hydrofluoric acid, the oxide film 60 (portion indicated by two-dotted chain lines) of the side wall 66 is removed by the etching. At this time, the thin oxide film 58 at the lower portion of the side wall 66 is also etched in the direction of the base electrode 49. Therefore, the nitride film 59 of the side wall 66 is formed so as to extend to the opening portion 56 side like a visor.

Thereafter, the resist film 65 is removed. As shown in the enlarged views of the first bipolar transistor in FIGS. 5C and 5D, by the selective epitaxial technique based on the ultra-high-vacuum chemical vapor deposition (UHV-CVD) method, the pressure-reduced CVD method or the like, the intrinsic base layer 68 of the first bipolar transistor formed of mixed crystal of silicon germanium (Si$_{1-x}$Ge$_x$) is formed on the N-type epitaxial layer 27 at the portion where the link base layer 61 and the thin oxide film 58 at the lower portion of the side wall 66 are etched. At this time, a part of the thin oxide film 58 at the lower portion of the side wall 66 is removed by the etching treatment of hydrofluoric acid, so that the intrinsic base layer 68 is formed so as to invade into the base electrode 49 side.

Subsequently, by the normal lithography technique, a resist film 69 (which is omitted from the illustration in FIG. 5D) is formed at the region where the first bipolar transistor will be formed. Subsequently, by the etching technique (for example, the reactive ion etching) using the resist film 69 as a mask, the nitride film 59 and the oxide film 60 on the region where the second bipolar transistor will be formed are etched to form a side wall 70 formed of the nitride film 59 and the oxide film 60 on the side wall of the opening portion 57. The opening portion surrounded by the side wall 70 will serve as the emitter opening portion 71. The upper layer of the base layer 63 is removed by the overetching of the reactive ion etching and the subsequent removal etching of the damage layer.

Subsequently, the same process as described with reference to FIGS. 4S to 4U is performed.

In the manufacturing method of the second embodiment, the thin oxide film 58 formed on the surface of the N-type epitaxial layer 27 at the lower portion of the side wall 66 is removed before the link base layer 61 of the first bipolar transistor is formed. Therefore, the intrinsic base layer 68 which is formed by the selective epitaxial growth is formed so as to invade into the direction of the base electrode 49 by the amount corresponding to the portion where the thin oxide film 58 at the lower portion of the side wall 66 is removed. Therefore, the end portion of the intrinsic base layer 68 is separated from the emitter layer 73 which is formed in the upper layer of the intrinsic base layer 68. As described above, the end portion of the intrinsic base layer 68 in which defects are liable to occur can be sufficiently far away from the emitter/base junction portion, so that the emitter/base junction can be stably formed.

As described above, according to the present invention, link base to connect the graft base layer of the first bipolar transistor and the intrinsic base layer formed by the epitaxial growth, and at least a part of the base layer of the second bipolar transistor are formed simultaneously with each other. Therefore, two kinds of bipolar transistors which are different in base width can be formed on the same substrate without making substantial additions to the process.

Further, since the intrinsic base layer is formed in the link base layer removed region by the selective epitaxial growth method, no P-type silicon germanium microcrystal is grown in a region other than the intrinsic base layer formed region, for example, on the side wall for separating the emitter and the base. Therefore, the base width of the intrinsic base layer of silicon germanium and the depth of the emitter layer formed in the upper layer of the intrinsic base layer can be controlled independently of each other.

Accordingly, bipolar transistors which are different in base width can be formed on the same substrate.

In the first bipolar transistor, after the film which is formed at the lower portion of the side wall for separating the base and the emitter and used as a buffer layer when the link base layer is formed is removed, the intrinsic base layer is formed by the selective epitaxial growth. Therefore, the end portion of the intrinsic base layer in which defect is liable to occur can be separated far away from the emitter/base junction portion by the amount corresponding to the portion at which the film used as the buffer layer is removed, whereby the emitter/base junction can be stably formed. Therefore, a bipolar transistor which is further improved in reliability can be formed.

What is claimed is:

1. A semiconductor device manufacturing method for forming a first bipolar transistor and a second bipolar transistor having different characteristics on a semiconductor substrate, comprising the steps of:

forming a first insulating film on said semiconductor substrate;

forming an opening portion in said first insulating film above each of an area where a base layer of said first bipolar transistor is formed and an area where a base layer of said second bipolar transistor will be formed;

simultaneously doping impurities into at least a partial semiconductor area below each of said opening portions;

conducting an anneal treatment to form a link base layer connecting the base layer of said first bipolar transistor and the base layer of said second bipolar transistor;

removing a part of the link base layer of said first bipolar transistor; and forming an intrinsic base layer of said first bipolar transistor by selective epitaxial growth on an area where said link base layer is removed.

2. A semiconductor device manufacturing method for forming a first bipolar transistor and a second bipolar transistor having different characteristics on a semiconductor substrate, comprising the steps of:

forming a first insulating film on said semiconductor substrate;

forming an opening portion in said first insulating film above each of an area where a base layer of said first bipolar transistor is formed and an area where a base layer of said second bipolar transistor will be formed;

simultaneously doping impurities into at least a partial semiconductor area below each of said opening portions;

conducting an anneal treatment to form a link base layer connecting the base layer of said first bipolar transistor and the base layer of said second bipolar transistor;

forming a second insulating film on said semiconductor substrate;

etching back said second insulating film in the area where said first bipolar transistor is formed to thereby forming a side wall spacer;

removing a part of said link base layer of said first bipolar transistor by using said side wall as a mask; and forming an intrinsic base layer of said first bipolar transistor by a selective epitaxial growth method in an area where said link base layer is removed.

3. The semiconductor device manufacturing method as claimed in claim 2, further comprising the steps of:

forming a third insulating film on at least the surface said link base layer;

forming said second insulating film on said third insulating film;

etching back said second insulating film to form a side wall;

etching said third insulating film and a part of the link base layer of said first bipolar transistor by using said side wall as a mask; and forming an intrinsic base layer of said first bipolar transistor by a selective-epitaxial growth method in the area where said link base layer is removed.

4. The semiconductor device manufacturing method as claimed in claim 2, wherein said etching step is performed by an isotropic etching treatment.

5. The semiconductor device manufacturing method as claimed in claim 3, wherein said side wall is designed in an overhang shape.

6. The semiconductor device manufacturing method as claimed in claim 1, wherein said intrinsic base layer is formed of SiGe.

7. A method of forming a bipolar transistor on a semiconductor substrate, comprising the steps of:

forming a first insulating film on a semiconductor substrate;

forming a first opening portion in said insulating film above an area where a base layer of said bipolar transistor is formed;

forming a second insulating film on said semiconductor area over said first opening portion;

doping impurities into the semiconductor area below said opening portion;

forming a side wall spacer in said first opening portion;

etching said second insulating film to form a third opening portion broader than a second opening portion which is defined by said side wall spacer;

etching a part of said semiconductor area; and forming an intrinsic base layer by selective epitaxial growth in said semiconductor area which is etched.

8. The semiconductor device manufacturing method as claimed in claim 7, wherein said etching step is performed by an isotropic etching.

9. The semiconductor device manufacturing method as claimed in claim 7, wherein said intrinsic base layer is formed of SiGe.

10. The semiconductor device manufacturing method as claimed in claim 7, wherein said side wall and said second insulating film are formed of different materials.

* * * * *